United States Patent
Covert et al.

[11] Patent Number: 5,989,443
[45] Date of Patent: *Nov. 23, 1999

[54] SELECTIVE ETCHING OF NICKLE/IRON ALLOYS

[75] Inventors: Kathleen Lorraine Covert, Vestal; Lisa Jeanine Jimarez, Newark Valley; Krystyna Waleria Semkow, Poughquag, all of N.Y.

[73] Assignee: International Business Machines Corporation, Armonk, N.Y.

[*] Notice: This patent is subject to a terminal disclaimer.

[21] Appl. No.: 08/943,662

[22] Filed: Oct. 3, 1997

Related U.S. Application Data

[63] Continuation of application No. 08/654,507, May 28, 1996, Pat. No. 5,723,062, which is a continuation of application No. 08/359,218, Dec. 19, 1994, Pat. No. 5,560,840.

[51] Int. Cl.$^6$ ............................... C23F 1/00; H05K 3/00
[52] U.S. Cl. ............................................. 216/13; 216/108
[58] Field of Search ........................ 216/108, 13

[56] References Cited

U.S. PATENT DOCUMENTS

| | | |
|---|---|---|
| 2,684,892 | 7/1954 | Saulnier . |
| 3,574,012 | 4/1971 | Penberg . |
| 3,625,908 | 12/1971 | Magin . |
| 3,878,006 | 4/1975 | Rice . |
| 4,305,779 | 12/1981 | Steeves et al. . |
| 4,361,445 | 11/1982 | Pryor et al. . |
| 4,420,366 | 12/1983 | Oka et al. . |
| 4,482,426 | 11/1984 | Maynard et al. . |
| 4,522,667 | 6/1985 | Hanson et al. . |
| 4,556,449 | 12/1985 | Nelson . |
| 5,221,417 | 6/1993 | Basavanhally . |
| 5,234,542 | 8/1993 | Cordani . |
| 5,363,553 | 11/1994 | Edwards et al. . |
| 5,518,131 | 5/1996 | Chen et al. . |
| 5,560,840 | 10/1996 | Covert et al. . |

FOREIGN PATENT DOCUMENTS 53-68644  6/1978  Japan .

*Primary Examiner*—Thi Dang
*Attorney, Agent, or Firm*—William N. Hogg

[57] ABSTRACT

The present invention provides a novel method of etching nickle/iron alloy which employs a novel etchant. The novel etchant, which etches nickle/iron alloy but not copper, comprises an aqueous solution of ferric ammonium sulfate, and an acid selected from the group consisting of: sulfuric acid; phosphoric acid; and mixtures thereof.

9 Claims, No Drawings

SELECTIVE ETCHING OF NICKLE/IRON ALLOYS

This is a continuation of application Ser. No. 08/654,507 filed on May 28, 1996, now U.S. Pat. No. 5,723,062, which is a continuation of Ser. No. 08/359,218 filed Dec. 19, 1994, now U.S. Pat. No. 5,560,840.

BACKGROUND OF THE INVENTION

Nickel-iron alloys, particularly 36% nickle/63% iron alloys, referred to herein as nickle/iron alloys, are used in the manufacture of printed circuit boards. A commonly used 36% nickle-63% iron alloy is available under the trademark Invar®. Copper-nickle/iron alloy structures, that is structures having at least one layer of nickle/iron alloy disposed along at least one layer of copper, are used for the manufacturing of high-performance structure that require power planes or wires in contact with dielectric containing fluoropolymers. The mechanical properties of nickle/iron alloy provide dimensional stability to the high performance structures when they are subjected to high temperature and/or high pressures during manufacturing processes, such as lamination. Frequently, there is a need to form holes such as through-holes extending through the nickle/iron alloy layer of copper-nickle/iron alloy structure. Nickle/iron alloy is very difficult to drill; due to the hardness of the nickle/iron alloy, the fine drill bits used to drill through-holes snap while drilling the nickle/iron alloy and require frequent replacement.

Accordingly, chemical etchants are employed to etch a hole in the nickle/iron alloy layer of nickle/iron alloy-copper structures. A photoresist is applied to the copper-nickle/iron alloy structure, and a chemical etchant is applied. The chemical etchant etches any areas not protected by a photoresist, to produce a hole having side walls with irregular surfaces. However, conventional etchants also etch copper and thus etch a hole in the copper layer as well as the nickle/iron alloy layer. For many circuit board designs an etched hole in the copper layer presents no problem or may even be desired. However, in certain applications it is desirable that the copper walls of the hole be uniform; such uniform hole walls are achieved by drilling rather than etching. Thus, when using conventional etchants, the etchants must be prevented from etching the copper layer; to do so, the etching of nickle/iron alloy is stopped prematurely leaving a thin layer of the nickle/iron alloy on the copper. The remaining nickle/iron alloy must then be drilled; the drilling still results in breakage of the drill bits.

It would be desirable to have a technique for etching the nickle/iron alloy layer of nickle/iron alloy-copper structures, and that does not involve drilling the nickle/iron alloy.

SUMMARY OF THE INVENTION

The present invention provides a novel method of etching nickle/iron alloy which employs a novel etchant. The novel etchant, which etches nickle/iron alloy but not copper, comprises an aqueous solution of ferric ammonium sulfate, and an acid which comprises sulfuric acid or phosphoric acid or mixtures thereof.

DETAILED DESCRIPTION OF THE INVENTION

The present invention provides a novel etching solution, referred to herein as the "ferric ammonium sulfate etchant" which etches nickle/iron alloy but not copper. The ferric ammonium sulfate etchant comprises an aqueous solution of ferric ammonium sulfate, and an acid comprising sulfuric acid or phosphoric acid or mixtures thereof; preferably the acid contains little or no chloride, other than what is present as impurities. Preferably, the acid is selected from the group consisting of: sulfuric acid; phosphoric acid; and mixtures thereof. The invention also relates to a method of etching structures that comprise copper and nickle/iron alloy, particularly forming holes employing the ferric ammonium sulfate etchant.

Holes are formed in the nickle/iron alloy layer of nickle/iron alloy-copper structures by etching a hole in the nickle/iron alloy layer with the novel ferric ammonium sulfate etchant. If a hole in the copper layer is required by the circuitization design, the hole is easily drilled through the copper layer using conventional techniques.

The ferric ammonium sulfate is present from an effective amount to etch nickle/iron alloy, but not copper, up to the solubility limit of the ferric ammonium sulfate, preferably from about 0.2 moles per liter to about 2.5 moles per liter, more preferably from about 0.25 moles per liter to about 1.0 moles per liter. The acid is present in the ferric ammonium etchant from about 0.1 molar to about 10 molar, preferably from about 0.5 to about 6 molar.

Optional ingredients, including, for example, surfactants, etc. may be added to the ferric ammonium sulfate etchant.

In the following examples, the sulfuric acid was concentrated acid, about 18 molar. The water was deionized. The ferric ammonium sulfate had a molecular weight of 482 g. and the following formula: $NH_4Fe(SO_4)_2 \cdot (H_2O)_{12}$.

EXAMPLES

Example 1

A ferric ammonium sulfate etchant was prepared by adding to 95 ml water, 5 ml. of concentrated sulfuric acid then adding 15 gm, that is 0.031 moles ferric ammonium sulfate, to provide a ferric ammonium sulfate etchant comprising 0.9 molar sulfuric acid and 0.31 molar ferric ammonium sulfate.

Example 2

A ferric ammonium sulfate etchant was prepared as in Example 1 except that 85 ml water and 15 ml. concentrated sulfuric acid were used, to provide a ferric ammonium sulfate etchant comprising 2.7 molar sulfuric acid and 0.31 molar ferric ammonium sulfate.

Example 3

A ferric ammonium sulfate etchant was prepared as in Example 1 except that 75 ml water and 25 ml. concentrated sulfuric acid were used, to provide a ferric ammonium sulfate etchant comprising 4.5 molar sulfuric acid and 0.31 molar ferric ammonium sulfate.

Example 4

A ferric ammonium sulfate etchant was prepared as in Example 1 except that 30 g. ferric ammonium sulfate was used, to provide a ferric ammonium sulfate etchant comprising 0.9 molar sulfuric acid and 0.62 molar ferric ammonium sulfate.

Example 5

A ferric ammonium sulfate etchant was prepared as in Example 1 except that 85 ml. water, 15 ml. sulfuric acid and 30 g. ferric ammonium sulfate were used, to provide a ferric ammonium sulfate etchant comprising 2.7 molar sulfuric acid and 0.62 molar ferric ammonium sulfate.

Example 6

A ferric ammonium sulfate etchant was prepared as in Example 1 except that 75 ml. water and 25 ml. concentrated sulfuric acid were used and 30 g. ferric ammonium sulfate was added, to provide a ferric ammonium sulfate etchant comprising 4.5 molar sulfuric acid and 0.62 molar ferric ammonium sulfate.

Example 7

A ferric ammonium sulfate etchant was prepared as in Example 1 except that 45 g. ferric ammonium sulfate was added, to provide a ferric ammonium sulfate etchant comprising 0.9 molar sulfuric acid and 0.93 molar ferric ammonium sulfate.

Example 8

A ferric ammonium sulfate etchant was prepared as in Example 1 except that 85 ml. water, 15 ml. sulfuric acid and 45 g. ferric ammonium sulfate were used to provide a ferric ammonium sulfate etchant comprising 2.7 molar sulfuric acid and 0.93 molar ferric ammonium sulfate.

Example 9

A ferric ammonium sulfate etchant was prepared as in Example 1 except that 75 ml. water, 25 ml. sulfuric acid and 45 g. of ferric ammonium sulfate were used to provide a ferric ammonium sulfate etchant comprising 4.5 molar sulfuric acid and 0.93 molar ferric ammonium sulfate.

Example 10

A ferric ammonium sulfate etchant was prepared as in Example 1, except that 10 ml 85% phosphoric acid was substituted for the sulfuric acid, 90 ml water and 45 g ferric ammonium sulfate were used to provide a ferric ammonium sulfate etchant comprising 1.5 molar phosphoric acid and 0.93 molar ferric ammonium sulfate.

Control Example A

An etching solution was prepared that contained no acid and 0.031 molar ferric ammonium sulfate.

Control Example B

An etching solution was prepared that contained no acid and 0.062 molar ferric ammonium sulfate.

Control Example C

An etching solution was prepared that contained no acid and 0.093 molar ferric ammonium sulfate.

Control Example D

An etching solution was prepared that contained no ferric ammonium sulfate, and 5 ml. sulfuric acid.

Control Example E

An etching solution was prepared that contained no ferric ammonium sulfate, and 15 ml. sulfuric acid.

Control Example F

An etching solution was prepared that contained no ferric ammonium sulfate, and 25 ml. sulfuric acid.

Control Example G

An etching solution was prepared that contained no ferric ammonium sulfate, and 25 ml. phosphoric acid.

Sample Evaluation

The ferric ammonium sulfate etchants from above examples 1–10 and the solutions from Control Examples A–G were evaluated using two inch square copper-nickle/iron alloy structures. The structure had a thin layer of 0.125 mil. copper disposed on a 0.75 mil. layer of invar• nickle/iron alloy. A copper-nickle/iron alloy• nickle/iron alloy structure was placed in the etching solution of the above examples, at room temperature, without agitation, for a total time of 20 minutes. The copper nickle/iron alloy• nickle/iron alloy structures were removed and examined visually. The results are shown in Table 1.

TABLE 1

| Example | ACID $H_2SO_4$ (ml) | SALT Ferric ammonium sulfate (grams) | Results |
|---|---|---|---|
| Control A | 0 | 15 | etched copper |
| Control B | 0 | 30 | etched copper |
| Control C | 0 | 45 | etched copper |
| 1 | 5 | 15 | slight nickle/iron alloy etching; nickle/iron alloy discolored |
| 2 | 15 | 15 | slight nickle/iron alloy etching; nickle/iron alloy discolored |
| 3 | 25 | 15 | slight nickle/iron alloy etching; nickle/iron alloy discolored |
| 4 | 5 | 30 | nickle/iron alloy etched but black |
| 5 | 15 | 30 | nickle/iron alloy etched but black |
| 6 | 25 | 30 | some etching of nickle/iron alloy |
| 7 | 5 | 45 | most of nickle/iron alloy etched; only very thin black nickle/iron alloy on copper |
| 8 | 15 | 45 | most of nickle/iron alloy etched; only very thin silver nickle/iron alloy on copper with copper exposed |
| 9 | 25 | 45 | very thin nickle/iron alloy with copper exposed |
| Control D | 5 | 0 | no effect on nickle/iron alloy or copper |
| Control E | 15 | 0 | no effect on nickle/iron alloy or copper |
| Control F | 25 | 0 | copper etched; copper plated on nickle/iron alloy |
| | $H_3PO_4$ | | |
| 10 | 10 | 45 | nickle/iron alloy etched, no effect on copper |
| Control G | 25 | 0 | no effect on copper or nickle/iron alloy |

The combination of the sulfuric acid and the ferric ammonium sulfate, in the Examples 1–9 etched the nickle/iron alloy but did not etch the copper. Under the conditions used to evaluate the ferric ammonium sulfate etchants, the most preferred etching solution is Example No. 8 which contains 15 ml. of sulfuric acid and 45 gm. of ferric ammonium sulfate. In contrast, the ferric ammonium sulfate control solution, which lacked acid, failed to etch the nickle/iron alloy and instead etched the copper. The control solutions containing 5 ml. or 15 ml. of sulfuric acid, but lacking the ferric ammonium sulfate, had little or no effect on the copper nickle/iron alloy• nickle/iron alloy structure. The control solution containing 25 ml. sulfuric acid, without ferric ammonium sulfate, not only failed to etch the nickle/iron alloy• nickle/iron alloy, but etched the copper; indeed the sulfuric acid even caused the copper to plate on the other nickle/iron alloy• nickle/iron alloy surface. Thus, the ability of the ferric ammonium sulfate solution to etch nickle/iron alloy but not copper is a result of the combination of the particular acid and the ferric ammonium sulfate since neither the acid nor salt alone can etch nickle/iron alloy without etching copper.

In addition to the ferric ammonium sulfate etchants disclosed in the examples it is to be understood that other solutions, containing either more or less acid and/or more or less ferric ammonium sulfate can also be used to selectively etch nickle/iron alloy. A dilute solution containing either less ferric ammonium sulfate, less acid or both can also be used to selectively etch nickle/iron alloy although the time required to etch the nickle/iron alloy may exceed 20 minutes. The time to selectively etch nickle/iron alloy can be reduced by heating the ferric ammonium sulfate etchant, agitating the structure, agitating the etchant or a combination of the foregoing.

Other etching solutions were also evaluated but did not selectively etch the nickle/iron alloy. For example, cupric chloride in HCl, etched copper from the structure and, due to a galvanic action, plated copper on the backside of the nickle/iron alloy. Ferric chloride in HCl, etched both copper and nickle/iron alloy. Ferric ammonium sulfate in HCl etched copper but not nickle/iron alloy. Ferric chloride in sulfuric acid etched copper but not nickle/iron alloy. Cupric chloride in phosphoric acid, and ferric chloride in phosphoric acid, etched both nickle/iron alloy and copper. Sodium persulfate in sulfuric acid, and potassium permanganate in sulfuric acid etched copper but not nickle/iron alloy. Sodium hypophosphate in phosphoric acid, oxalic acid, oxalic acid and sulfuric acid, permanganate in oxalic acid, and ferric oxide in HCl produced no effect. 10 While the ferric ammonium sulfate etchant has been described in terms of etching 36% nickle/63% iron alloy, it is also useful for etching other nickle iron alloys, stainless steel and stainless steel alloys. The ferric ammonium sulfate etchant is also useful for selective etching in that in addition to copper, it does not etch the noble metals such as gold.

Although certain embodiments of this invention have been shown and described, various adaptations and modifications can be made without departing from the scope of the invention as defined in the appended claims.

What is claimed is:

1. A method for producing a copper-nickel/iron alloy printed circuit board structure comprising the following steps:

providing a printed circuit board structure having a copper layer and a nickel/iron alloy layer disposed on the copper layer;

selectively etching the nickel/iron alloy from the copper layer on the printed circuit board structure by contacting the printed circuit board structure with an aqueous etchant comprising from an effective amount to etch nickel/iron alloy but not copper, of ferric ammonium sulfate. and from about 0.1 to about 10 molar sulfuric acid or phosphoric acid.

2. The method of claim 1, wherein the acid comprises sulfuric acid.

3. The method of claim 1, wherein the acid comprises phosphoric acid.

4. The method of claim 1 wherein the etchant comprises from about 0.1 to about 10 molar sulfuric acid, and from about 0.2 to about 2.5 molar ferric ammonium sulfate.

5. The method of claim 1 wherein the etchant comprises from about 0.5 to about 6 molar sulfuric acid and from about 0.25 to about 1.0 molar ferric ammonium sulfate.

6. The method of claim 1 wherein the etchant comprises from about 0.1 to about 10 molar phosphoric acid and from about 0.2 to about 2.5 molar ferric ammonium sulfate.

7. The method of claim 1 wherein the etchant comprises from about 0.5 to about 6 molar phosphoric acid and from about 0.25 to about 1.0 molar ferric ammonium sulfate.

8. The method of claim 1 wherein the etchant comprises about 0.93 molar ferric ammonium sulfate; and an acid, wherein the acid consists essentially of about 3 molar sulfuric acid.

9. The method of claim 1 wherein the etchant comprises about 0.93 molar ferric ammonium sulfate; wherein the acid consists essentially of about 1.5 molar phosphoric acid.

* * * * *